United States Patent
Sekine et al.

(10) Patent No.: US 9,559,178 B2
(45) Date of Patent: Jan. 31, 2017

(54) NON-VOLATILE MEMORY (NVM) CELL AND DEVICE STRUCTURE INTEGRATION

(71) Applicant: FREESCALE SEMICONDUCTOR, INC., Austin, TX (US)

(72) Inventors: Satoshi Sekine, Austin, TX (US); Cheong Min Hong, Austin, TX (US)

(73) Assignee: NXP USA, Inc., Austin, TX (US)

( * ) Notice: Subject to any disclaimer, the term of this patent is extended or adjusted under 35 U.S.C. 154(b) by 18 days.

(21) Appl. No.: 14/604,323

(22) Filed: Jan. 23, 2015

(65) Prior Publication Data

US 2016/0218112 A1    Jul. 28, 2016

(51) Int. Cl.
| | |
|---|---|
| H01L 27/108 | (2006.01) |
| H01L 21/336 | (2006.01) |
| H01L 29/423 | (2006.01) |
| H01L 27/115 | (2006.01) |
| H01L 21/28 | (2006.01) |
| H01L 29/792 | (2006.01) |

(52) U.S. Cl.
CPC ... *H01L 29/42348* (2013.01); *H01L 21/28273* (2013.01); *H01L 21/28282* (2013.01); *H01L 27/11519* (2013.01); *H01L 27/11524* (2013.01); *H01L 27/11568* (2013.01); *H01L 29/42328* (2013.01); *H01L 29/42332* (2013.01); *H01L 29/42344* (2013.01); *H01L 29/7923* (2013.01)

(58) Field of Classification Search
CPC .............. H01L 29/42348; H01L 27/11568
USPC ..................... 257/298, 316, 319; 438/267
See application file for complete search history.

(56) References Cited

U.S. PATENT DOCUMENTS

| | | | | |
|---|---|---|---|---|
| 7,271,050 B2 | 9/2007 | Hill | | |
| 8,373,216 B2 * | 2/2013 | Chakihara | ......... | H01L 21/28273 257/298 |
| 8,389,365 B2 * | 3/2013 | Shroff | ............... | H01L 27/11536 438/275 |
| 8,932,925 B1 * | 1/2015 | Hong | ................ | H01L 29/66181 438/261 |

OTHER PUBLICATIONS

Krishnan et al., "A Manufacturable Dual Channel (Si and SiGe) High-K Metal Gate CMOS Technology with Multiple Oxides for High Performance and Low Power Applications", IEEE International Electron Devices Meeting, 2011, 4 pages.

* cited by examiner

*Primary Examiner* — Calvin Lee

(57) ABSTRACT

A dielectric layer is formed over the substrate in the capacitor region and the memory region and a select gate layer is formed over the dielectric layer. A select gate is formed over the memory region and a plurality of lines of electrodes over the capacitor region from the select gate layer. A charge storage layer is formed over the capacitor region and the memory region including over the select gate and the plurality of lines. A control gate layer is formed over the charge storage layer over the capacitor region and over the memory region. The control gate layer is patterned to form a control gate of a memory cell over the memory region and a first electrode of a capacitor over the capacitor region. The plurality of lines are connected to the capacitor region to form a second electrode of the capacitor.

18 Claims, 4 Drawing Sheets

US 9,559,178 B2

NON-VOLATILE MEMORY (NVM) CELL AND DEVICE STRUCTURE INTEGRATION

BACKGROUND

Field

This disclosure relates generally to non-volatile memories (NVMs) and device structures, and more particularly, to integrating NVM cells with device structures.

Related Art

Bypass capacitors are very critical on regulated voltage nodes (linear and switch capacitor) nodes and also on power supply nodes to filter the noise out of electrical circuits. In split gate NVM technologies, charge pump voltages can go as high 15 Volts and generally semiconductor technology nodes do not support devices/capacitors that operate at this voltage rating. Thus the amount of bypass capacitor that can be used in the technology nodes is limited. To get around this limitation, capacitors with a very low capacitance per unit area are formed in series, consuming valuable space in the area available in an integrated circuit. Thus, a solution for adding the required amount of capacitance while reducing the amount of space required in an integrated circuit is desired.

In addition, the integration of non-volatile memories (NVMs) with any other device structure has always been a challenge due to the different requirements for the NVM transistors, which store charge, and other device structures which are commonly intended for some other functions such as a capacitor. The need for storing charge has been addressed mostly with the use of floating gates but also with nanocrystals or nitride. In any of these cases, the need for this unique layer makes integration of the NVM transistors and the logic transistors difficult, particularly when using a split-gate structure for the NVM. The particular type of charge storage layer can also have a large effect on the options that are available in achieving the integration. Accordingly there is a need to provide an integration that improves upon one or more of the issues raised above.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale.

DETAILED DESCRIPTION

In one aspect, an integration of a split-gate non-volatile-memory (NVM) cell and a device structure includes using a first conductive layer that forms a select gate and a second conductive layer that forms control gate of the NVM cell also are used to form electrodes of the device structure. The resulting device structure has enhanced capacitive characteristics. This is better understood by reference to the drawings and the following written description.

The semiconductor substrate described herein can be any semiconductor material or combinations of materials, such as gallium arsenide, silicon germanium, silicon-on-insulator (SOI), silicon, monocrystalline silicon, the like, and combinations of the above. Oxide layer refers to a silicon oxide layer unless otherwise noted. Similarly, nitride layer refers to a silicon nitride layer unless otherwise noted.

Figure 1:
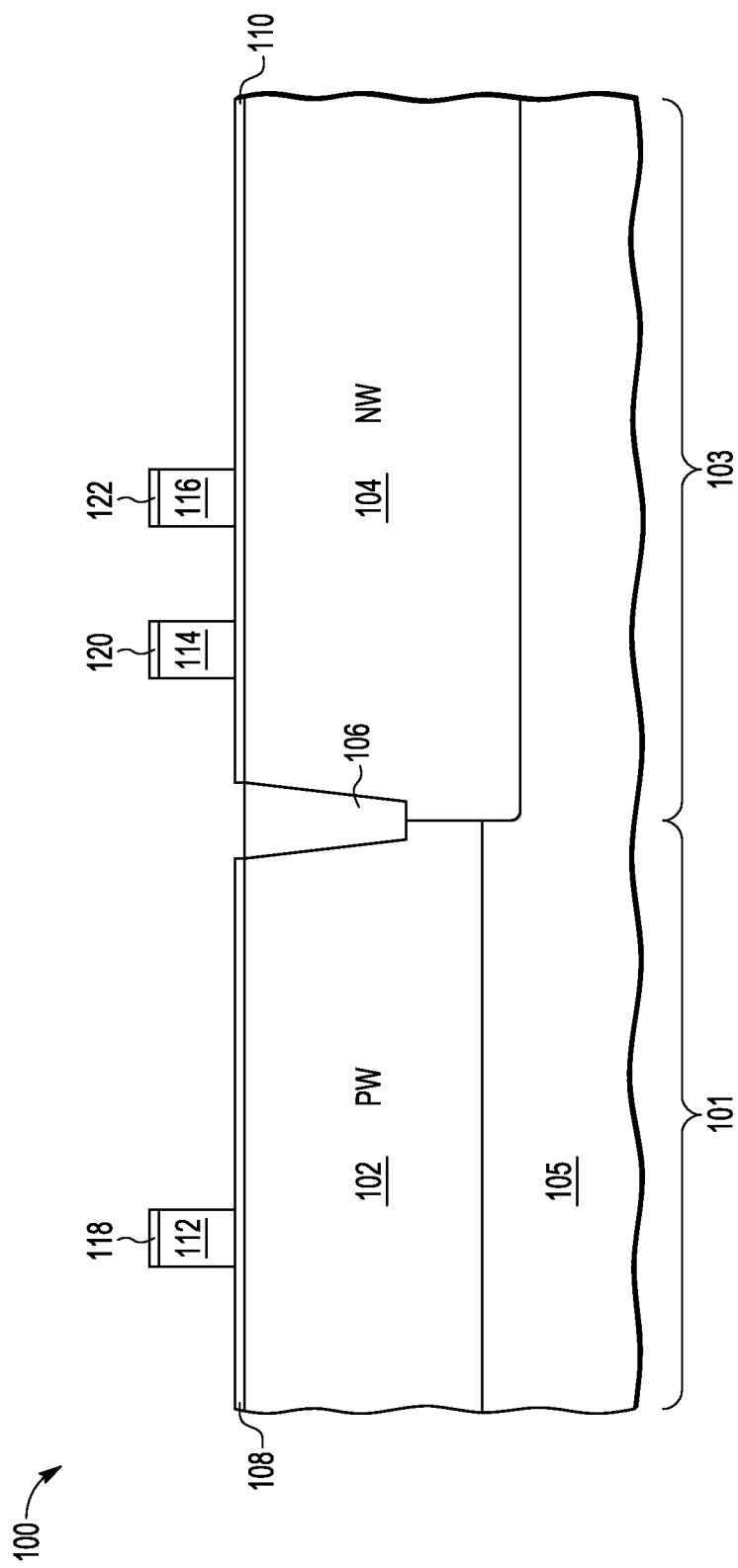
FIG. 1 is a cross section of a semiconductor structure having a split-gate non-volatile-memory (NVM) structure and a device structure at a stage in processing according to an embodiment.

Shown in FIG. 1 is a semiconductor structure 100 of an integrated circuit having an a first region 101 for use in forming a split-gate NVM cell and a second region 103 for use in forming a device structure which may be a capacitor. The device structure in second region 103 could also be a transistor particularly suited for high voltage or even as an alternative NVM type of cell. Semiconductor structure 100 has a substrate 105, an isolation region 106 separating first region 101 from second region 103, a P-well 102 in first region 101, N-well 104 in second region 103, an oxide or dielectric layer 108 on the top surface of substrate 105 in first region 101 and an oxide layer 110 on the top surface of substrate 105 in second region 103. Oxide layers 108, 110 are a thermal oxide that is grown, rather than deposited, for high quality. Over oxide layer 108, polysilicon layer 112 has been deposited and patterned etched that may be doped in situ or by implant. Over oxide layer 110, polysilicon layers 114, 116 have been deposited and patterned etched and may be doped in situ or by implant. Note that polysilicon layers 112, 114, 116 may be formed from a single layer of polysilicon that is blanket deposited and etched to form separate polysilicon layers 112 114, 116. A single anti-reflective coating (ARC) layer may be blanket deposited over the polysilicon. The polysilicon and ARC layers may then be etched to leave ARC layers 118, 120, 122 over respective polysilicon layers 112, 114, 116. ARC layers 118, 120, 122 may be formed of nitride or other suitable material. One or more insulating or dielectric layers (not shown) may be deposited between polysilicon layers 112-116 and ARC layers 118-122.

Substrate 105 may be P type or N type. By way of example, oxide layers 108, 110 may be formed concurrently and may be 20 to 60 Angstroms thick. Polysilicon layer 112, 114, 116 may be 400 to 1200 Angstroms thick. Polysilicon layer 112 remaining in first region 101 is for use as a select gate of an NVM cell to be formed in first region 101. Polysilicon layers 114, 116 remaining in second region 103 will be part of another device to be formed in second region 103.

Figure 2:
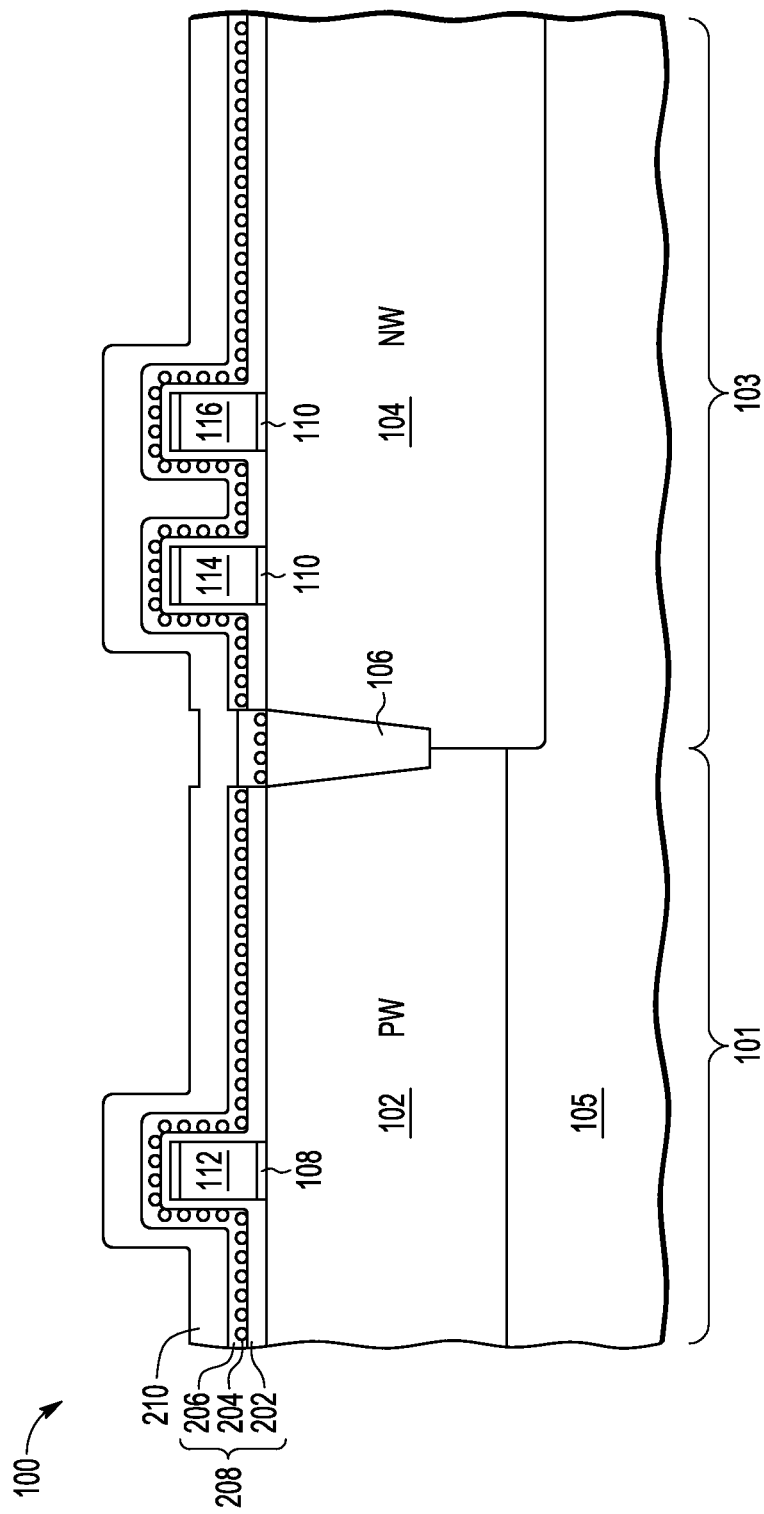
FIG. 2 is a cross section of the semiconductor structure of FIG. 1 at a subsequent stage in processing.

Shown in FIG. 2 is semiconductor structure 100 after growing an oxide layer 202 on substrate 105 except in isolation region 106 and where substrate 105 is covered by polysilicon layers 112, 114, 116, along the sidewalls of polysilicon layers 112, 114, 116 and ARC layers 118-122. Oxide layer 202 may be 30-100 Angstroms thick.

A plurality of nanoclusters 204 are then formed on oxide layer 202 in regions 101 and 103 and on isolation region 106. A top oxide layer 206 is then deposited on and around the plurality of nanoclusters 204. Oxide layer 202, plurality of nanoclusters 204, and oxide layer 206 together result in a charge storage layer 208 that has been formed over an exposed portion of substrate 105 and over select gate 112 in first region 101 and on substrate 105 and over polysilicon layers 114, 116 in second region 103.

Conductive layer 210 is then deposited on charge storage layer 208. Conductive layer 210 may be a layer of polysilicon that has been doped in situ or by implant and may be 400 to 1200 Angstroms in thickness.

Figure 3:
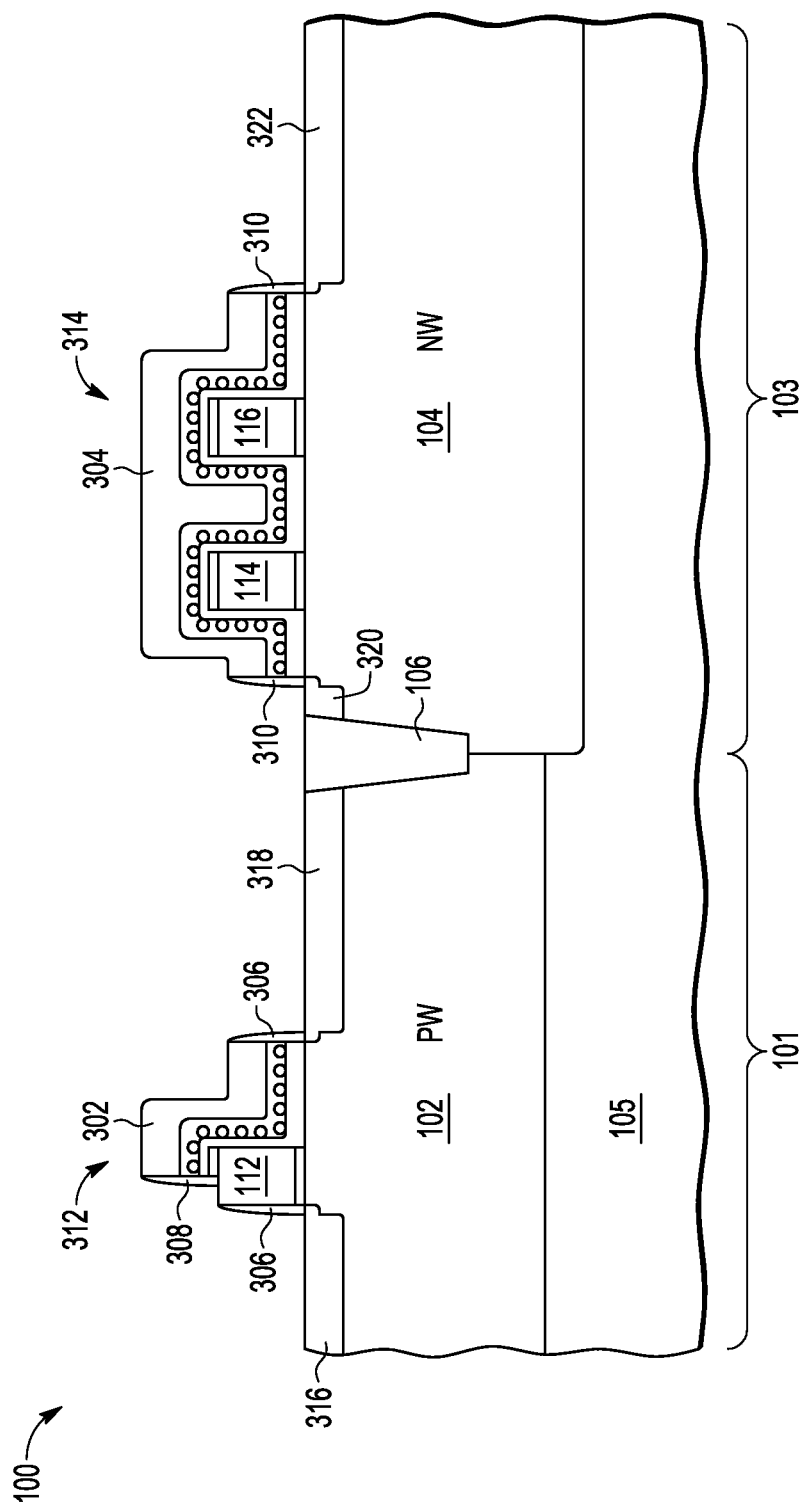
FIG. 3 is a cross section of the semiconductor structure of FIG. 2 at a subsequent stage in processing.

Shown in FIG. 3 is semiconductor structure 100 after etching conductive layer 210, charge storage layer 208, a portion of ARC layer 118 and dielectric layer 108 to leave a portion of charge storage layer 208, ARC layer 118, and conductive layer 210 over a remaining portion of ARC layer 118, along a first sidewall of ARC layer 118, polysilicon layer 112 and oxide layer 108, and over portion of substrate 105 adjacent to the first sidewall of select gate 112 in region 101. During the same etch process, conductive layer 210 and charge storage layer 208 are etched in region 103 so that a portion of conductive layer 304 and charge storage layer 208 remain over and adjacent portions of dielectric layer 108, polysilicon layers 114, 116, and ARC layers 120, 122. The portion of conductive layer 302 in region 101 is for use as a control gate and may be referenced as control gate 302. The remaining portion of charge storage layer 210 adjacent to the first sidewall is between select gate 112 and control gate 302. The remaining portion of conductive layer 210 in second region 103 may be used an electrode of device structure 314 and may be referenced as electrode 304.

Sidewall spacers 306, 308 are then formed on exposed sides of select gate 112, control gate 302, and charge storage layer 208 in first region 101 and forming sidewall spacer 310 on the sides of electrode 304 in second region 103 to result in a device structure 314 that may be used as a capacitor, an NVM cell, or a high voltage transistor. Select gate 112 may be in common to more than one memory cell 312. Source/drain regions 316, 318 are then formed in P-well 102 under and adjacent spacer 306 to result in a split-gate NVM cell 312 in first region 101. Source/drain regions 320, 322 are formed in N-well 104 adjacent spacer 310 to complete device structure 314.

Figure 4:
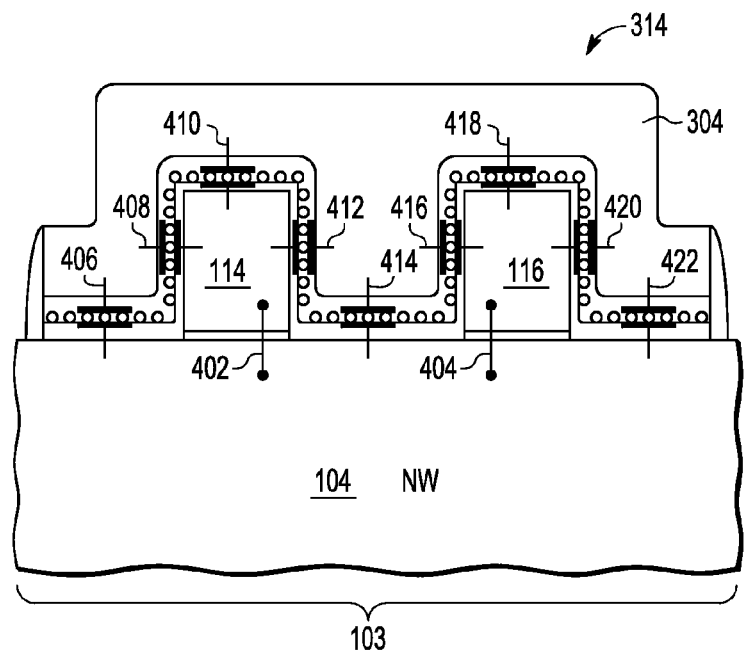
FIG. 4 is a cross section of a portion of the semiconductor structure of FIG. 3 showing capacitances in the device structure.

Shown in FIG. 4 illustrates semiconductor structure 100 showing polysilicon layers 114, 116 electrically connected with conductive vias 402, 404 to N-well 104 for the case of device structure 314 being used as a capacitor. In such case, vias 402, 404 could be connected together to be one electrode of the capacitor, with electrode 304 being a second electrode the capacitor.

The use of the charge storage layer 208, which uses nanoclusters as the dielectric layer of a capacitor results in several small capacitances 406, 408, 410, 412, 414, 416, 418, 420 with capacitances 406, 414 and 422 arranged horizontally between N-well 104 and conductive layer 304, capacitances 408, 412, 416, 420 arranged vertically between sidewalls of polysilicon layers 114, 116 and conductive layer 304, and capacitances 410, 418 arranged horizontally between a top of polysilicon layers 114, 116 and conductive layer 304. The plurality of relatively small capacitances 406-420 add in parallel to be equivalent to a single high voltage capacitor. NVM cells such as NVM cell 312 require high voltage for program and erase. By using common elements in forming the capacitor as in forming the NVM cell 312, the high voltage capability of the capacitor 314 will correspond to the high voltage program and erase needs of the NVM cell. That is to say, that the ability to generate a high voltage with the capacitor will scale with the high voltage requirements of NVM cell 312.

Figure 5:
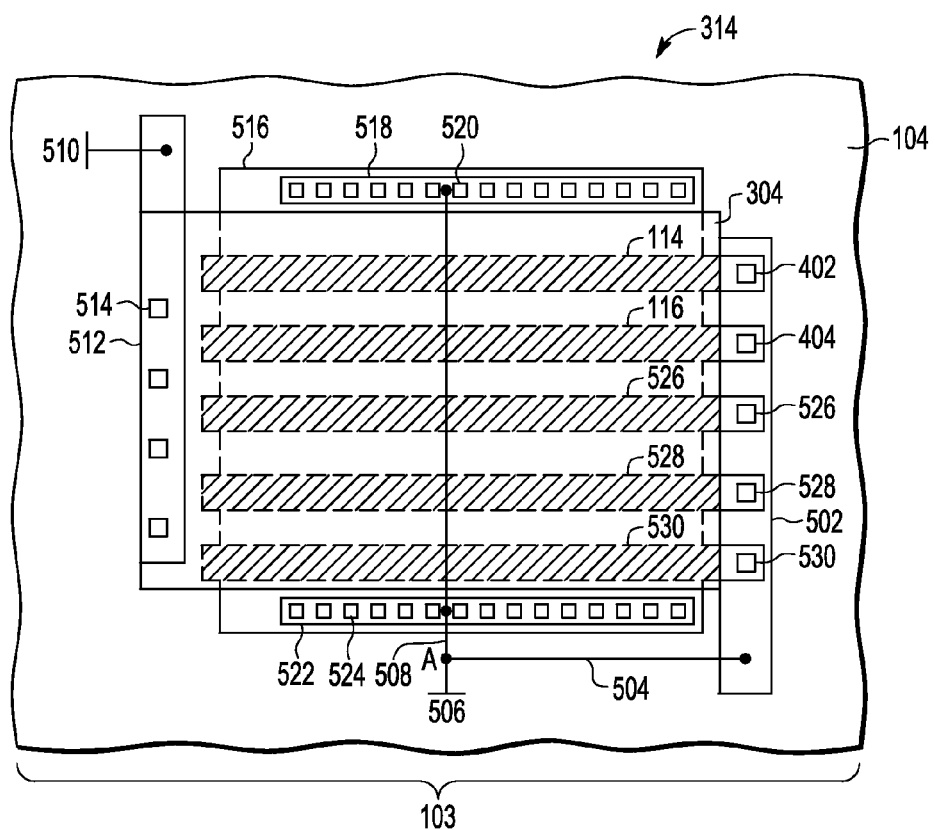
FIG. 5 is a top view of a portion of the semiconductor structure of FIG. 4 and circuit connections for particular use of the device structure as a capacitor.

FIG. 5 is a top view of a portion of the semiconductor structure of FIG. 4 and circuit connections for particular use of the device structure 314 as a capacitor. Strips of polysilicon layers 114, 116, 522, 528, 530 are shown over active region 516 of N-well 104. Conductive layer 304 is shown over polysilicon layers 114, 116, 522, 528, 530. A first metal or conductive strip 502 is shown overlapping an end of the each of polysilicon layers 114, 116, 522, 528, 530. Conductive vias 402, 404, 526, 528, 530 are shown connecting one end of respective polysilicon layers 114, 116, 522, 528, 530 to conductive strip 502. Conductive strip 502 is not connected to any components of device structure 314 other than polysilicon layers 114, 116, 522, 528, 530.

A conductive trace 504 extends from conductive strip 502 to connect with another conductive trace 508 at node A. Terminal or end 506 of conductive trace 508 can be used as a first electrode of device structure 314. Another end of conductive trace 508 is shown connected to conductive strip 518, which is electrically coupled to active region 516 adjacent and parallel to polysilicon layer 402. An intermediate point of conductive trace 508 is shown connected to another conductive strip 522, which is electrically coupled to active region 516 adjacent and parallel to polysilicon layer 530. Connecting conductive trace 508 to multiple locations of active region 516 decreases any voltage drop due to resistance of N-well 104.

Another conductive strip 512 is electrically connected to one end of conductive layer 304 by one or more conductive vias 514. Conductive strip 512 is perpendicular to another end of polysilicon layers 114, 116, 522, 528, 530 opposite the connections to conductive strip 502. Conductive trace with terminal end 510 is coupled to conductive strip 512 and can be used as another electrode of device structure 314.

Any suitable number of polysilicon layers 114, 116, 522, 528, 530 can be included in device structure 314 to provide the required capacitance. Any number of device structures 314 can be included in semiconductor device 100 in addition to any suitable number memory cells 312.

By now it should be appreciated that in some embodiments there has been provided a method of making a semiconductor device (100) using a substrate (105) having a capacitor region (104) and a memory region (102) that can comprise forming a dielectric layer (108) over the substrate in the capacitor region and the memory region, forming a select gate layer (112, 114, 116)) over the dielectric layer in the capacitor region and the memory region, forming a select gate (112) over the memory region and a plurality of lines of electrodes (114, 116) over the capacitor region from the select gate layer, forming a charge storage layer (208) over the capacitor region and the memory region including over the select gate and the plurality of lines of electrodes, forming a control gate layer (210) over the charge storage layer over the capacitor region and over the memory region, patterning the control gate layer to form a control gate (302) of a memory cell over the memory region and a first electrode (304) of a capacitor over the capacitor region, and connecting (502, 504) the plurality of lines of electrodes to the capacitor region to form a second electrode of the capacitor.

In another aspect, the charge storage layer can comprise nanoclusters (204).

In another aspect, the charge storage layer further comprises a bottom oxide (202) and a top oxide (206).

In another aspect, the capacitor region comprises a first well of a first conductivity type.

In another aspect, the first conductivity type can comprise N-type.

In another aspect, the memory region can comprise a second well that is P-type.

In another aspect, the select gate layer can comprise polysilicon.

In another aspect, the control gate layer can comprise polysilicon.

In another aspect, the connecting the plurality of lines can comprise forming a first metal strap (502) over the capacitor region, connecting the plurality of lines to the first metal strap, and connecting the capacitor region to the metal strap.

In another aspect, the method can further comprise forming first sidewall spacer (306) adjacent to the select gate and a sidewall spacer (310) adjacent to the first electrode of the capacitor.

In other embodiments, a semiconductor device having a substrate (105) with a capacitor region (104) and a memory region (102) can comprising a memory cell (FIG. 3) comprising a gate dielectric (108), a select gate (112), a first charge storage layer (208); and a control gate (302). The gate dielectric is over the memory region, the select gate has a first thickness and is over the gate dielectric, the first charge storage layer has a first portion over the select gate, a second portion along a sidewall of the select gate, and a third portion extending laterally from the select gate; and the control gate has a second thickness and is over the first, second, and third portions of the first charge storage layer. A capacitor (FIG. 3) having a first dielectric (110) is over the capacitor region. The device can further have a plurality of conductive lines (120, 122), a second charge storage layer (208), and a conductive layer (304). The plurality of conductive lines are over the first dielectric, have sidewalls, are separated by separation regions, and have the first thickness. The second charge storage layer has first portions over the plurality of conductive lines, second portions along the sidewalls of the plurality of conductive lines, and third portions in the separation regions. The conductive layer has the second thickness, is over the second charge storage layer, and has first portions over the plurality of conductive lines, second portions along the sidewalls of the plurality of conductive lines, and third portions in the separation regions.

In another aspect, the select gate and the plurality of conductive lines are of the same material.

In another aspect, the control gate and the conductive layer are of the same material.

In another aspect, the select gate, the plurality of conductive lines, the control gate, and the conductive layer can comprise polysilicon.

In another aspect, the first portion of the first charge storage layer and the first portions of the second charge storage layer can have the same thickness.

In another aspect, the first charge storage layer and the second charge storage layer can comprise a bottom dielectric layer (202), a layer of nanoclusters (204) on the bottom dielectric layer, and a top dielectric layer (206) over and around the nanoclusters.

In another aspect, the semiconductor device can further comprise a metal strap (502) connected to the plurality of conductive lines and to the capacitor region.

In another aspect, a connection of the plurality of conductivity line to the capacitor region forms a first terminal of the capacitor and the conductive layer forms a second terminal of the capacitor.

In still other embodiments, a method of making a memory cell (FIG. 3) and a capacitor (FIG. 3) using a substrate (105) having a capacitor region (104) and a memory region (102), can comprise forming a select gate (112) over the memory region and a plurality conductive lines (114, 116) over the capacitor region from a first common layer; forming a nanocluster layer (204) over the select gate and over the plurality of conductive lines; forming a control gate (302) over the nanocluster layer in the memory region and a first terminal (304) of the capacitor over the nanocluster layer in the capacitor region from a second common layer (210); and forming a second terminal of the capacitor by connecting (502, 506, 508) the plurality of conductive lines to the capacitor region.

In another aspect, the first common layer can comprise a first layer deposited over the substrate. The second common layer can comprise a second layer deposited after forming the nanocluster layer. The conductive lines can be connected to the capacitor region through a metal strap (502). Capacitance of the capacitor can include capacitance from the second common layer being along sidewalls of the plurality of conductive lines, over the capacitor region in areas between the plurality of conductive lines, and over the plurality of conductive lines.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, different materials than those described may be found to be effective. As another example, any memory structure with two adjacent layers of conductive material can be used instead of memory cells with overlapping conductive layers. Further, any type of dielectric material in addition to or instead of nanoclusters can be used between the conductive layers. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:
1. A semiconductor device comprising:
 a substrate having a capacitor region with a first doped well and a memory region with a second doped well;
 a dielectric layer over the substrate in the capacitor region and the memory region;

a select gate layer over the dielectric layer in the capacitor region and the memory region;
a select gate over the memory region and a plurality of lines of electrodes over the capacitor region from the select gate layer;
a charge storage layer over the capacitor region and the memory region including over the select gate and the plurality of lines of electrodes;
a control gate layer over the charge storage layer over the capacitor region and over the memory region; and
conductive vias electrically connecting the plurality of conductive lines to the first doped well, wherein:
the control gate layer is patterned to form a control gate of a memory cell over the memory region and a first electrode of a capacitor over the capacitor region
the plurality of lines of electrodes are connected to the first doped well in the capacitor region to form a second electrode of the capacitor.

2. The semiconductor device of claim 1, wherein the select gate layer comprises polysilicon.

3. The semiconductor device of claim 1, wherein the control gate layer comprises polysilicon.

4. The semiconductor device of claim 1, further comprising:
a first metal strap over the capacitor region;
the plurality of lines of electrodes connected to the first metal strap; and
the first doped well connected to the metal strap.

5. The semiconductor device of claim 1, further comprising a first sidewall spacer adjacent to the select gate and a sidewall spacer adjacent to the first electrode of the capacitor.

6. The semiconductor device of claim 1, wherein the charge storage layer comprises nanoclusters.

7. The semiconductor device of claim 6, wherein the charge storage layer further comprises a bottom oxide and a top oxide.

8. The semiconductor device of claim 1, wherein the first doped well has a first conductivity type.

9. The semiconductor device of claim 8, wherein the first conductivity type comprises N-type.

10. The semiconductor device of claim 9, wherein the second doped well is P-type.

11. A semiconductor device having a substrate, wherein the substrate has a capacitor region including a first doped well and a memory region including a second doped well, comprising:
a memory cell in the memory region, the memory cell comprising a gate dielectric, a select gate, a first charge storage layer; and a control gate, wherein:
the select gate has a first thickness and is over the gate dielectric;
the first charge storage layer has a first portion over the select gate, a second portion along a sidewall of the select gate, and a third portion extending laterally from the select gate; and
the control gate has a second thickness and is over the first, second, and third portions of the first charge storage layer; and
a capacitor having a first dielectric over the capacitor region; a plurality of conductive lines, a second charge storage layer; a conductive layer, and conductive vias electrically connecting the plurality of conductive lines to the first doped well, wherein:
the plurality of conductive lines are over the first dielectric, have sidewalls, are separated by separation regions, and have the first thickness;
the second charge storage layer has first portions over the plurality of conductive lines, second portions along the sidewalls of the plurality of conductive lines, and third portions in the separation regions; and
the conductive layer has the second thickness, is over the second charge storage layer, and has first portions over the plurality of conductive lines, second portions along the sidewalls of the plurality of conductive lines, and third portions in the separation regions.

12. The semiconductor device of claim 11, wherein the first portion of the first charge storage layer and the first portions of the second charge storage layer have the same thickness.

13. The semiconductor device of claim 11, wherein the first charge storage layer and the second charge storage layer comprise a bottom dielectric layer, a layer of nanoclusters on the bottom dielectric layer, and a top dielectric layer over and around the nanoclusters.

14. The semiconductor device of claim 11, further comprising a metal strap connected to the plurality of conductive lines and to the capacitor region.

15. The semiconductor device of claim 11, wherein a connection of the plurality of conductive lines to the capacitor region forms a first terminal of the capacitor and the conductive layer forms a second terminal of the capacitor.

16. The semiconductor device of claim 11, wherein the select gate and the plurality of conductive lines are of the same material.

17. The semiconductor device of claim 16, wherein the control gate and the conductive layer are of the same material.

18. The semiconductor device of claim 17, wherein the select gate, the plurality of conductive lines, the control gate, and the conductive layer comprise polysilicon.

* * * * *